(12) United States Patent
Schweitzer, III et al.

(10) Patent No.: US 11,121,536 B2
(45) Date of Patent: Sep. 14, 2021

(54) DIGITAL INPUT ELECTRIC POWER SYSTEM PANEL METER

(71) Applicant: Schweitzer Engineering Laboratories, Inc., Pullman, WA (US)

(72) Inventors: Edmund O. Schweitzer, III, Pullman, WA (US); Krishnanjan Gubba Ravikumar, Pullman, WA (US); Austin Edward Wade, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/035,963

(22) Filed: Sep. 29, 2020

(65) Prior Publication Data

US 2021/0111550 A1    Apr. 15, 2021

Related U.S. Application Data

(60) Provisional application No. 62/914,489, filed on Oct. 13, 2019.

(51) Int. Cl.
*G01R 22/10* (2006.01)
*H02H 1/00* (2006.01)
(Continued)

(52) U.S. Cl.
CPC ......... *H02H 1/0069* (2013.01); *G01R 22/061* (2013.01); *G01R 22/10* (2013.01);
(Continued)

(58) Field of Classification Search
CPC .. G01R 22/061; G01R 22/10; G01R 19/2513; G01R 31/3274; G01R 35/02; G01R 31/3278; G08B 21/185; G08B 29/06; H02H 1/0069; H02H 3/20; H02H 7/22; H02H 1/0061; H02H 1/0092; H02H 3/027; H02H 7/261; H02H 1/00; H02H 1/0023; H02H 1/06; H02H 3/04; H02H 3/202;
(Continued)

(56) References Cited

U.S. PATENT DOCUMENTS 6,396,279 B1  5/2002  Gruenert
6,608,493 B2  8/2003  Hensler
(Continued)

OTHER PUBLICATIONS

David Costello: Understanding and Analyzing Event Report Information, Oct. 2000.
(Continued)

*Primary Examiner* — Vinh P Nguyen
(74) *Attorney, Agent, or Firm* — Gregory C Baker; Richard M Edge

(57) ABSTRACT

Systems and methods for displaying electric power system metering information in a panel may use digitized signals from primary protection relays. The system may include multiple panel meters. One or more of the panel meters may receive the digitized signals using an electrically non-conductive communication media. In various embodiments, the panel may be electrically isolated from the primary protection relay. The panel may be hot swappable and may be connected to a primary protection relay while the relay is in continuous operation.

18 Claims, 7 Drawing Sheets

(51) Int. Cl.
*H04B 10/25* (2013.01)
*H02H 3/20* (2006.01)
*H02H 7/22* (2006.01)
*G08B 21/18* (2006.01)
*G01R 22/06* (2006.01)
*H02J 13/00* (2006.01)

(52) U.S. Cl.
CPC ............ *G08B 21/185* (2013.01); *H02H 3/20* (2013.01); *H02H 7/22* (2013.01); *H04B 10/25* (2013.01); *H02J 13/00* (2013.01)

(58) Field of Classification Search
CPC .......... H02H 7/26; H02J 13/00; H04B 10/25; G05B 23/0256; H01H 47/001; H01H 47/002; H04L 63/02; H04L 63/0227; H04L 63/1441
See application file for complete search history.

(56) References Cited

U.S. PATENT DOCUMENTS

| | | | |
|---|---|---|---|
| 6,792,337 B2* | 9/2004 | Blackett | G01D 4/00 700/295 |
| 6,795,789 B2 | 9/2004 | Vandiver | |
| 6,847,297 B2 | 1/2005 | Lavoie | |
| 6,892,115 B2 | 5/2005 | Berkcan | |
| 6,892,145 B2 | 5/2005 | Topka | |
| 6,909,942 B2 | 6/2005 | Andarawis | |
| 6,985,784 B2 | 1/2006 | Vandevanter | |
| 6,999,291 B2 | 2/2006 | Andarawis | |
| 7,012,421 B2 | 3/2006 | Lavoie | |
| 7,043,340 B2 | 5/2006 | Papallo | |
| 7,058,481 B2 | 6/2006 | Jiang | |
| 7,058,482 B2 | 6/2006 | Fletcher | |
| 7,068,483 B2 | 6/2006 | Papallo | |
| 7,068,612 B2 | 6/2006 | Berkcan | |
| 7,111,195 B2 | 9/2006 | Berkcan | |
| 7,117,105 B2 | 10/2006 | Premerlani | |
| 7,151,329 B2 | 12/2006 | Andarawis | |
| 7,254,001 B2 | 8/2007 | Papallo | |
| 7,259,565 B2 | 8/2007 | Diercks | |
| 7,262,943 B2 | 8/2007 | Stellato | |
| 7,301,738 B2 | 11/2007 | Pearlman | |
| 7,460,590 B2 | 12/2008 | Lee | |
| 7,532,955 B2 | 5/2009 | Dougherty | |
| 7,636,616 B2 | 12/2009 | Fletcher | |
| 7,693,607 B2 | 4/2010 | Kasztenny | |
| 7,747,354 B2 | 6/2010 | Papallo | |
| 7,747,356 B2 | 6/2010 | Andarawis | |
| 7,986,503 B2 | 7/2011 | Papallo | |
| 8,024,494 B2 | 10/2011 | Soed | |
| 8,213,144 B2 | 7/2012 | Papallo | |
| 8,515,348 B2* | 8/2013 | Kagan | G01R 22/063 455/41.2 |
| 8,560,255 B2 | 10/2013 | Elwarry | |
| 8,891,963 B2 | 11/2014 | Patel | |
| 9,366,711 B2 | 6/2016 | Klapper | |
| 9,632,147 B2 | 4/2017 | Hensler | |
| 9,819,611 B2 | 11/2017 | Snowdon | |
| 9,927,470 B2* | 3/2018 | Zhu | G01R 21/133 |
| 10,178,047 B2 | 1/2019 | Chapman | |
| 10,379,991 B2 | 8/2019 | Yang | |
| 10,430,263 B2* | 10/2019 | Polar Seminario | G06F 11/1441 |
| 10,951,057 B1* | 3/2021 | Schweitzer, III | H02J 9/061 |
| 2003/0048508 A1 | 3/2003 | Yu | |
| 2009/0012728 A1 | 1/2009 | Spanier | |
| 2009/0296583 A1 | 12/2009 | Dolezilek | |
| 2010/0040068 A1 | 2/2010 | Wimmer | |
| 2010/0183298 A1 | 7/2010 | Biegert | |
| 2016/0013632 A1 | 1/2016 | Lloyd | |
| 2017/0026291 A1 | 1/2017 | Smith | |
| 2017/0288950 A1 | 10/2017 | Manson | |
| 2018/0034689 A1 | 2/2018 | Kanabar | |
| 2018/0089057 A1 | 3/2018 | Yang | |
| 2018/0348267 A1 | 12/2018 | Yang | |

OTHER PUBLICATIONS

Joe Perez: A Guide to Digital Fault Recording Event Analysis, 2010.
Considerations for Use of Disturbance Recorders; a Report to the System Protection Subcommittee of the Power System Relaying Committee of the IEEE Power Engineering Society, Dec. 27, 2006.
David Costello: Event Analysis Tutorial, Part 1: Problem Statements 2011.
Jane Starck, Antti Hakala-Ranta, Martin Stefanka, Switchgear Optimization Using IEC 61850-9-2 and Non-Conventional Measurements May 23, 2012.
Will Allen, Tony Lee: Flexible High-Speed Load Shedding Using a Crosspoint Switch Oct. 2005.
Qiaoyin Yang, Rhett Smith: Improve Protection Communications Network Reliability Throught Software-Defined Process Bus, Jan. 2018.
Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

\* cited by examiner

DIGITAL INPUT ELECTRIC POWER SYSTEM PANEL METER

RELATED APPLICATION

This application claims priority to U.S. Provisional Patent Application No. 62/914,489, filed Oct. 13, 2019, for "Digital Input Electric Power System Panel Meter," the disclosure of which is hereby incorporated in its entirety by this reference.

TECHNICAL FIELD

This disclosure relates to a panel meter for an electric power system receiving digital inputs.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
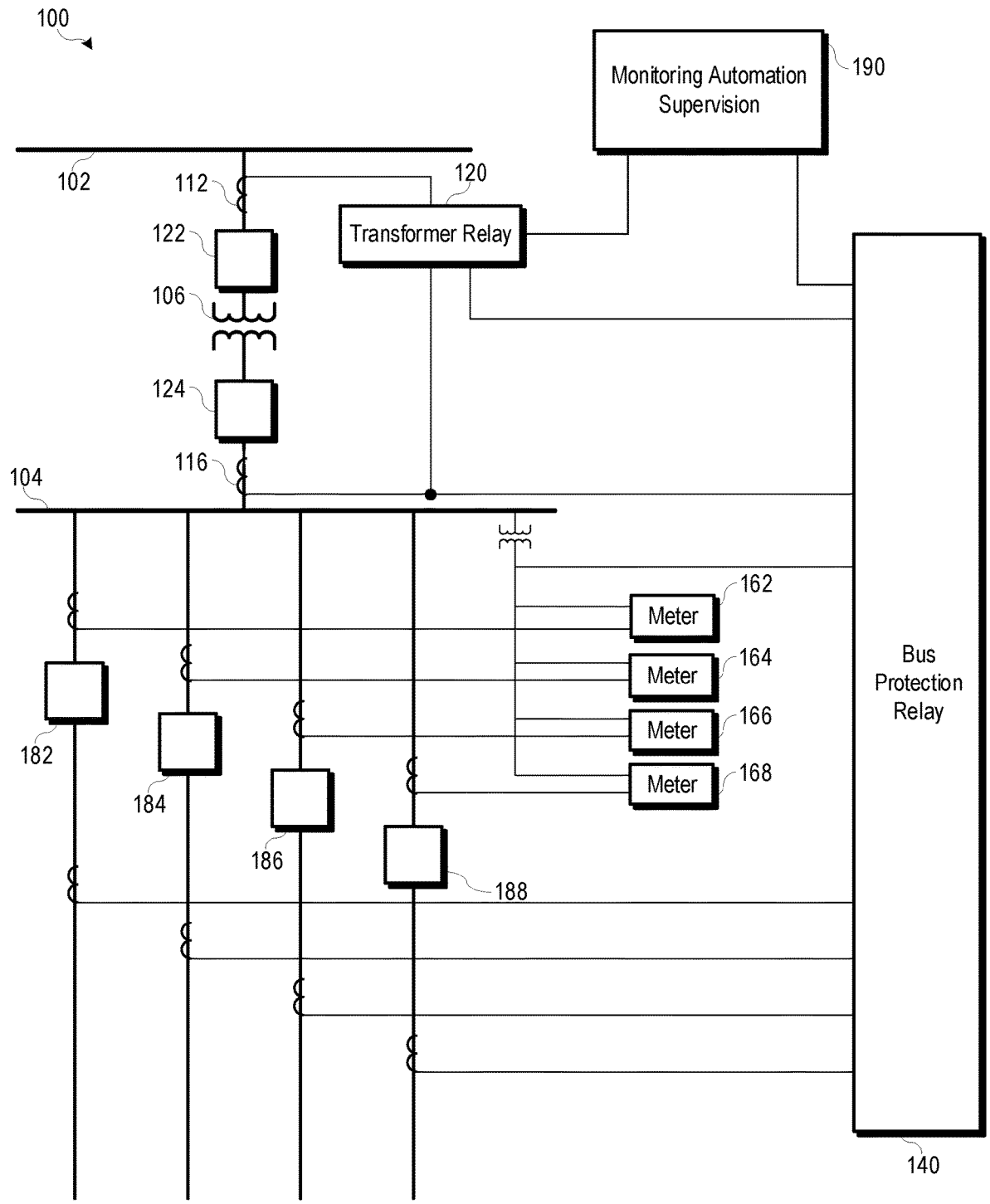
FIG. 1 illustrates a simplified one-line diagram of an electric power delivery system for providing electric power to loads including a system of intelligent electronic devices (IEDs) and relays for protection and automation.

Electric power delivery systems are widely used to generate, transmit, and distribute electric power to loads, and serve as an important part of the critical infrastructure. Power systems and components are often monitored and protected by intelligent electronic devices (IEDs) and systems of IEDs that obtain electric power system information from the equipment and provide protective actions, monitor, and automate the power system. Several IEDs may be in communication to facilitate sharing of information for station-wide, area-wide, or even system-wide protection.

Various IEDs may be configured as meters, to obtain electric power system measurements, calculate power system attributes, and store, display, and transmit selected calculated power system attributes. Meters may be used to determine an amount of power passing through a metering point on the power system. Panel meters may be used on panels to provide a display of certain power system attributes.

In order to obtain the proper signals, panel meters require a multitude of connections to instrument transformers. Numerous connections increase the possibility of wiring errors to the meter. Connections to certain instrument transformers such as current transformers (CTs) provide dangerous potential if the circuit with the CT is ever opened. Further, conductive wiring between instrument transformers and power system panels provides a pathway for dangerous power surges into the substation.

Prior to the widespread use of microprocessor-based IEDs for electric power system protection, electromechanical relays were used for such protection, and panel meters were used to display certain attributes of the protected system. Because microprocessor-based IEDs generally include a display, panel meters are not required for the display of power system attributes. However, pioneering protection systems include certain primary protection relays without displays and/or installed closer to primary equipment. This results in fewer displays available in the control panel as well as fewer electrical conductors from instrument transformers into the control house. Embodiments of the present disclosure include systems and devices for display of power system attributes in the control house without a need to return to the use of electrical conductors in the control house to provide signals to panel meters.

For example, embodiments of the present disclosure include a panel meter (e.g., an external meter) capable of providing metering functions without electrical connection to instrument transformers. Embodiments of the present disclosure further include a display for primary protection devices. Disclosed herein are several embodiments that include panel meters for providing a display for primary protection devices, in addition to providing metering functions without electrical connection to instrument transformers.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. In addition, data being tied or rendered together in a database record may be resident in the same memory device, or across several memory devices, and may be linked together in fields of a record in a database across a network. Embodiments may be provided as a computer program product including a non-transitory computer and/or machine-readable medium having stored thereon instructions that may be used to program a computer (or other electronic devices) to perform processes described herein.

FIG. 1 illustrates a simplified one-line diagram of an electric power delivery system 100. It should be noted that system 100 may include multiple phases and additional equipment and complexity. The power system includes various equipment such as a bus 102 (illustrated as a transmission bus) providing electric power to a second bus 104 (illustrated as a distribution bus) via a transformer 106 for stepping down the power from a high (transmission) voltage to a lower (distribution) voltage. Various feeders extend from the second bus 104 for delivering electric power to distributed loads. Circuit breakers 122, 124, 182, 184, 186, 188 may be used to selectively connect and disconnect portions of the power system for various purposes such as reconfiguration, protection in the event of a fault, or the like.

A bus protection relay 140 may be an IED configured to determine operating conditions on a zone that includes the second bus 104 and provide signals to effect a protection operation upon determination of an adverse condition. IED 140 may obtain current signals related to electric power entering the bus 104, voltages from bus 104, and current signals related to electric power leaving bus 104 on the feeders. IED 140 may be configured to provide differential protection, overvoltage protection, and various other protection for a zone including the bus 104.

Feeder protection relays (not separately illustrated) may be IEDs that obtain bus voltage signals and current signals related to the feeders. Feeder protection relays may provide overcurrent, directional, distance, overfrequency, underfrequency, and other protection to the feeders.

Transformer relay 120 may be configured to provide protection to the transformer 106. Transformer relay 120 may obtain current signals from both sides of the transformer 106 from CTs 112 and 116. Transformer relay 120 may further provide information to bus protection relay 140. Transformer relay 120 may be configured to provide differential protection overcurrent protection, over frequency protection, underfrequency protection, and other various protection for the transformer 106.

IEDs may be in communication (directly, through merging units, or the like) with various circuit breakers 122, 124, 182, 184, 186, and 188 to provide signals to the circuit breakers to interrupt the flow of electrical current and/or receive status information from the circuit breakers. In various embodiments, the IEDs may be in communication with a monitoring, automation, or other supervisory system or device 190, such as a SCADA system.

Meters 162, 164, 166, 168 may obtain power system currents and/or voltages using instrument transformers in electrical communication with various equipment of the power system. As illustrated, meters 162, 164, 166, 168 obtain current signals from the feeders, and may obtain voltage signals from the feeders or (as illustrated) from bus 104. Meters 162, 164, 166, 168 may be placed in panels within a control house, and may be in electrical connection with instrument transformers using conductors.

Figure 2:
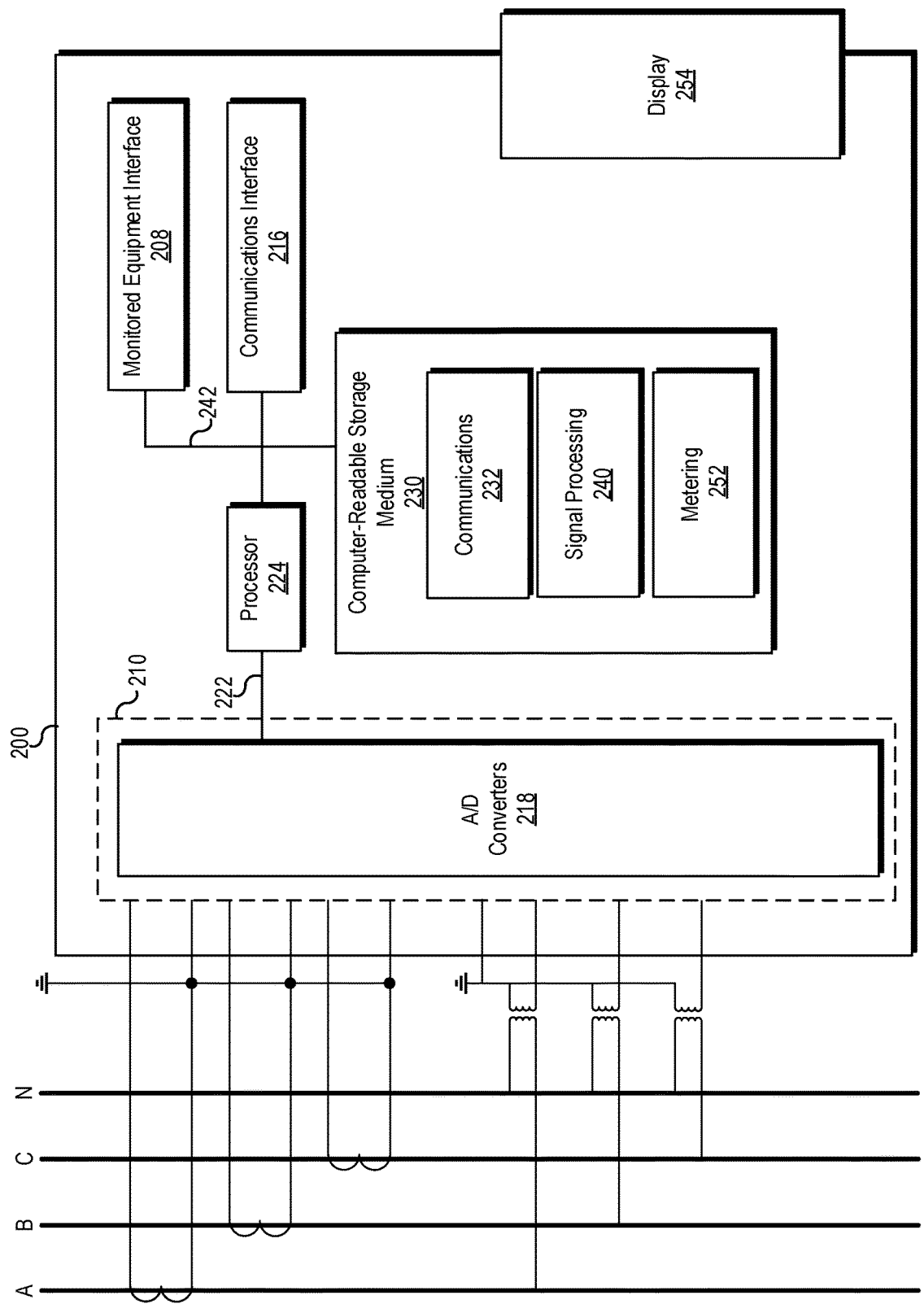
FIG. 2 illustrates a simplified block diagram of an IED in the electric power system metering.

FIG. 2 illustrates a simplified block diagram of a meter 200 representative of the meters illustrated in FIG. 1. The meter 200 receives power system information such as currents and voltages using instrument transformers including CTs and potential transformers (PTs). As illustrated, the meter 200 obtains analog current and voltage signals from CTs and PTs. As illustrated, to obtain current and voltage signals from a three-phase system many physical electrical connections are required between the CTs, PTs, and the meter 200. Meter 200 may include sampling circuitry 210 including current input and voltage input. Such inputs may include various additional transformers, filters, and other hardware to condition the analog signals for sampling and digitizing by one or more analog-to-digital converter(s) (ND) 218. The digitized signals 222 may be provided to a processor 224.

Meter 200 may include various inputs and interfaces such as communications interface 216, provided to facilitate communications with SCADA, other IEDs or the like. A monitored equipment interface 208 may be in communication with monitored equipment such as circuit breakers, transformers, capacitor banks, voltage regulators, reclosers, or the like to send command signals to the equipment and/or receive status information from the equipment. A computer-readable storage medium 230 may be a repository of computer instructions for execution on the processor 224. In various other embodiments, the processor may be embodied as a dedicated processing device such as a field-programmable gate array (FPGA) operating various protection instructions. Various components may be in communication via a communications bus 242.

The computer-readable storage medium 230 may include instructions for execution of various operations of the meter 200. For example, communications instructions 232 may be executed by the processor such that the meter 200 performs communication functions with other devices. The communications instructions 232 may include instructions for formatting communications, receiving communications, addresses for communicating, settings related to compliance with IEC 61850 communications standards, and the like. Signal processing instructions 240 may include instructions for processing current, voltage, and other signals for use by other protection and monitoring functions. For example, signal processing 240 may include various digital filters, resampling, and the like. Metering instructions 252 may include instructions for performing various metering functions such as quantifying and/or calculations of current, voltage, phasors, power, frequency, KYZ pulses, volt-ampere reactives (VARs), apparent power, symmetrical components, and the like, as well as instructions for formatting such calculations for communication and display.

The meter 200 may include a display 254 for displaying information to a user. Various display configurations and technologies may be used. The display may provide a human-readable display of the calculated current, voltage, phasors, power, frequency, KYZ pulses, VARs, apparent power, symmetrical components, and the like. Attributes may be displayed on a per-phase basis. Attributes averaged over a time period or cumulative over a time period may be displayed. The display may be configurable by a user in the substation.

Due to the electrical connectors to instrument transformers, high-voltage signals may be brought into the substation and used by the meter. Further, the number of connections provides a possibility for wiring errors. Various embodiments consistent with the present disclosure may reduce the possibility of wiring errors and reduce or eliminate the need for high-voltage signals.

Figure 3:
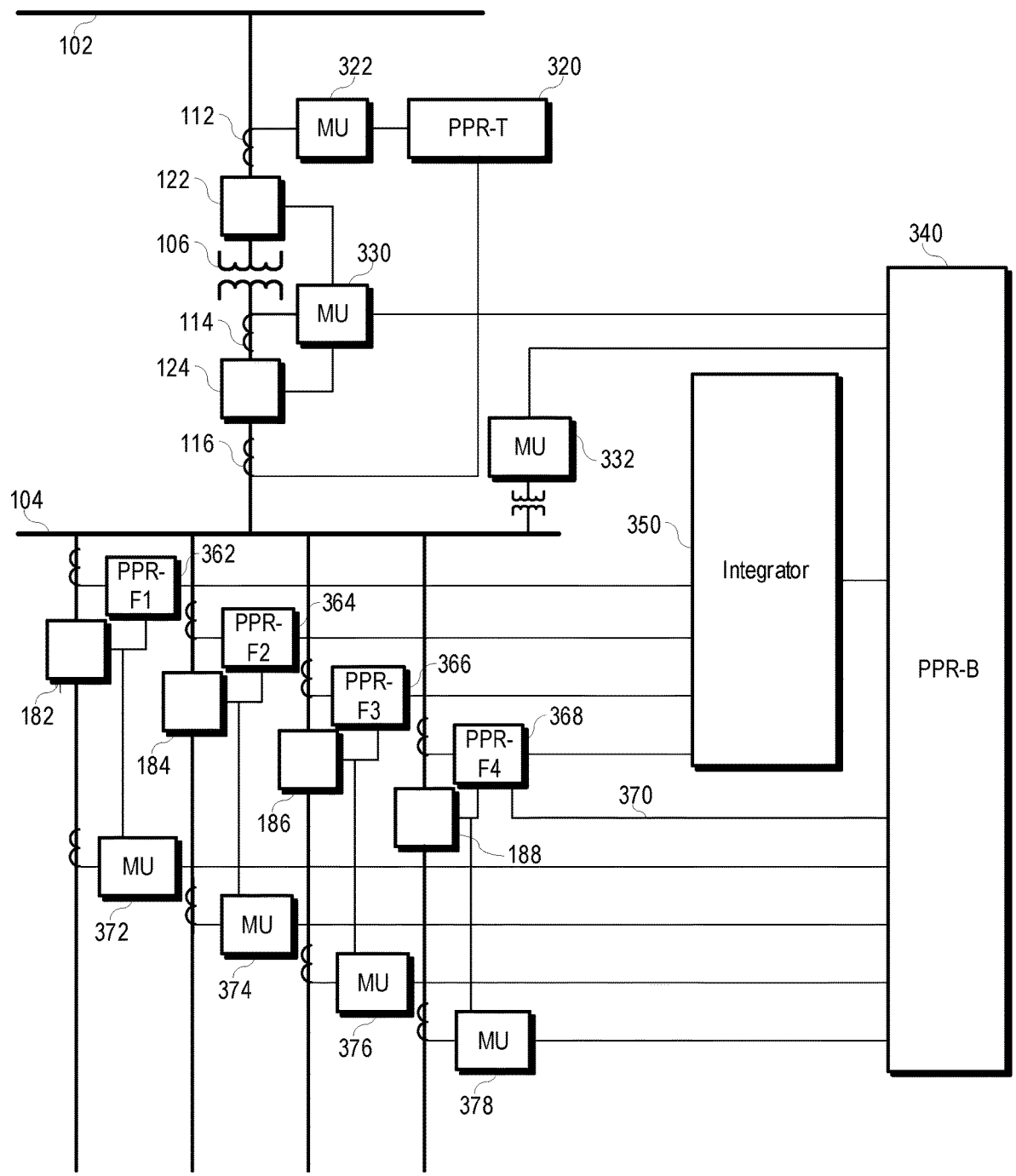
FIG. 3 illustrates a simplified one-line diagram of an electric power delivery system for providing electric power to loads including a resilient protection system in accordance with embodiments of the disclosure.

FIG. 3 illustrates a simplified one-line diagram of an electric power delivery system including a protection system in accordance with the present disclosure. The protection system includes various primary protection relays: primary transformer protection relay PPR-T 320, primary bus protection relay PPR-B 340, primary feeder protection relays PPR-F1 362, PPR-F2 364, PPR-F3 366, and PPR-F4 368, that do not depend on communication with an automation, monitoring, or supervisory system, such as integrator 350, to continue providing critical protection to the electric power delivery system equipment. Such primary protection relays may be used to separate primary protection functions from other functions traditionally performed by IEDs. Primary protection relays may be installed in a substation or outside of a substation closer to the primary equipment being protected. Primary protection relays may obtain signals using a merging unit or directly from instrument transformers or communication with primary equipment. Primary protection relays may include no display or a minimal display, as they are used primarily for protection, leaving ancillary functions to the integrator 350.

Communication among primary protection relays may be facilitated by integrator 350. Primary protection relays 320, 340, 362, 364, 366, 368 may obtain power system signals using merging units such as MUs 322, 330, 332, 372, 374, 376, 378; using instrument transformers; or the like. Information collected by the primary protection relays may be provided to integrator 350.

Feeders from bus 104 may be protected using feeder relays PPR-F1 362, PPR-F2 364, PPR-F3 366, and PPR-F4 368. Feeder relays 362-368 may obtain current signals from respective feeders using CTs and/or merging units such as MUs 372, 374, 376, 378. Feeder relays 362-368 may further obtain voltage signals from the bus using a potential transformer (PT) and/or a merging unit such as MU 332. Using the current and/or voltage signals, the feeder relays 362-368 may determine operating conditions on the respective feeders including, for example: phase overcurrent; ground overcurrent; neutral overcurrent; negative sequence overcurrent; arc flash; overvoltage, under-voltage; directional power; over-frequency; under-frequency; rate-of-change-of-frequency; fault direction; fault distance; and the like. In the event of a condition determined outside of predetermined operating conditions, the feeder relay 362-368 may be configured to send an open or trip command to an associated circuit breaker, thus effecting a protective action on the electric power delivery system.

Feeder relays 362-368 may be in communication with respective circuit breakers 182, 184, 186, 188 as illustrated. In various embodiments, the feeder relays 362-368 may be in direct communication with the circuit breakers 182-188 as illustrated. In various other embodiments, the feeder relays 362-368 may be in communication with the circuit breakers 182-188 via merging units such as MUs 372-378. Accordingly, feeder relays 362-368 may provide protection to the feeders using measurements from the power system, using the measurements in one or more protective elements and effecting a protective action by commanding a circuit breaker to open.

The protection system may include an integrator 350 in communication with various devices and equipment in the electric power delivery system. The integrator 350 may perform monitoring, automation, supervisory, communication, secondary (noncritical, backup, or the like) protection, and other functions. As illustrated, the primary protection relays (such as, for example, the transformer relay 320 and the feeder relays 362-368) may be in communication with the integrator 350. According to various embodiments, the primary protection relays may transmit digitized values representing analog measurements, states, and/or commands to the integrator 350 useful for its monitoring, automation, backup, supervisory, and other functions, and for communication to other primary protection relays. The primary protection relays may transmit such communications in accordance with a predetermined communication protocol. In various embodiments, the protocol includes an identification of the primary protection relay that is sending the communication, and a payload of the predetermined set of signal values, states, and commands. The payload may vary depending on the type of primary protection relay (feeder protection relay, transformer protection relay, bus protection relay, or the like). A user may apply settings to the primary protection relay governing which signal values, states, and commands are transmitted. Primary protection relays may be configured to transmit such communications in accordance with a predetermined schedule. Primary protection relays may continuously send such communications regardless of a change in state or command.

As mentioned above, each primary protection relay is configured to perform critical protection functions for the equipment monitored thereby with or without communications with the integrator 350, other primary protection relays, or IEDs. For example, the transformer relay PPR-T 320 may perform over-current protection, over-voltage protection, under-voltage protection, and differential protection for the transformer 106 using signals obtained from the equipment regardless of communication with the integrator 350 or other devices. Further automation, control, and protection functions may be performed using signals from other primary protection relays or supervisory systems received by transformer relay 320 via the integrator 350.

The protection system may also include a primary protection relay in the form of a bus protection relay 340 configured to provide protective functions to the bus 104. Bus protection relay 340 may be a primary protection relay, as it is capable of obtaining power system measurements and providing protective functions without communication with any monitoring or other supervisory system. Bus protection relay 340 may obtain electric power system measurements related to electric power entering and leaving the protected bus 104 using CTs, PTs, and the like and/or merging units. As illustrated, bus protection relay 340 obtains current measurements on one side of the bus 104 from merging unit 330 which obtains current signals using CT 114. Voltage measurements may be obtained from merging unit 332 which obtains voltage signals from bus 104 using a PT. Measurements of current on the other side of the bus 104 may be obtained from merging units 372, 374, 376, 378, which obtain current signals from the feeders using CTs. The bus protection relay 340 may use the currents and/or voltages to perform various protection functions such as, for example: overcurrent (phase, ground, neutral); breaker failure; time over-current; current differential; under-voltage; over-voltage; and the like. The bus protection relay 340 may be configured to protect a zone of the electric power delivery system such as, for example, between circuit breaker 124 and breakers 182-188. The bus protection relay 340 may be configured to detect an event using the currents and/or voltages, and send a trip command to one or more circuit breakers to remove power from a portion of the power system affected by the event.

Similar to the primary protection relays 320 and 362-368, the bus relay is configured to continue providing protective functions to the power system regardless of the availability of any integrator, monitoring, automation, or supervisory systems or devices. In various embodiments described herein, the primary protection relays 320, 340, 362-368 may be configured to primarily perform protective functions, with secondary functions being removed to a separate device such as the integrator 350.

The integrator 350 may be configured to communicate monitoring, automation, and supervisory information to the primary protection relays, and to facilitate communications among the primary protection relays. For example, the integrator 350 may be configured to perform breaker failure analysis to determine if a breaker has operated after a signal has been sent to open the breaker. If the integrator 350 determines that the breaker has not opened, it may send a signal to the merging unit and/or to the appropriate primary protection relay to attempt to open the breaker. The integrator 350 may also signal a second breaker to open, where the second breaker is positioned to also remove power from the impacted portion of the electric power delivery system. For example, upon failure of breaker 182, the integrator 350 may signal for breaker 122 or 124 to open, removing power from the bus 104 and related feeders.

The integrator 350 may further be configured to send specified communications from certain primary protection relays to appropriate receiving primary protection relays. For example, bus 104 voltage measurements from the primary bus protection relay PPR-B 340 may be useful for certain protection operations of the feeder protection relays 362-368. Accordingly, the integrator 350 may be configured to send bus voltage measurements from PPR-B 340 to each of the feeder protection relays 362-368 by routing such voltage measurements to the communications ports associated with each of the feeder protection relays 362-368.

Communication between the primary protection relays and the integrator may be bi-directional. In various embodiments, the integrator 350 may include multiple communications ports, each associated with a different primary protection relay. Each communications channel may be synchronous or asynchronous. Each communications channel may be deterministic such that communications among primary protection devices is deterministic. With different communication ports in communication with different primary protection relays, the integrator 350 may be easily configured to route specific communications among different primary protection relays by simply routing the communications between different communication ports.

Communications from the primary protection relays may include digitized analog signals related to the electric power system signals. Primary protection relays may be configured to communicate such digitized analogs to the integrator or other receiving devices.

The system illustrated in FIG. 3 comprises multiple primary protective relays and other types of equipment (e.g., MUs, breakers, etc.), that may provide useful information to an operator. Selectively visualizing this data may allow users to operate more effectively while avoiding the need for a dedicated meter for each device. For example, when performing one task, the current measured by CT 116 may be useful, but when performing another task, the voltage on bus 104 may be necessary. Meters consistent with the present disclosure may allow a user to selectively display information from different devices, using information passed through integrator 350, rather than hard-wiring meters to specific components in system 300.

Figure 4:
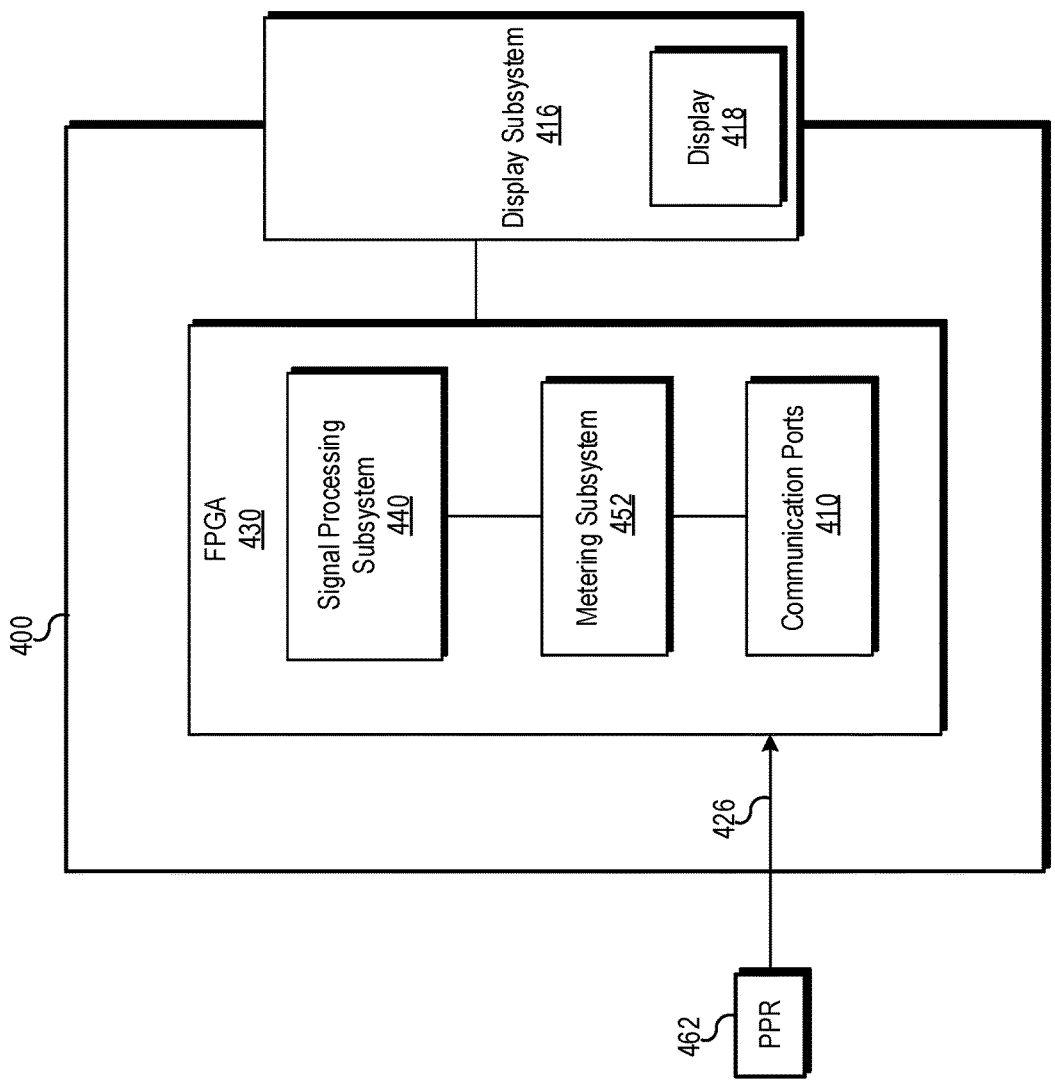
FIG. 4 illustrates a simplified functional block diagram of a panel meter in accordance with embodiments of the disclosure.

FIG. 4 illustrates a simplified functional block diagram of a panel meter 400 in accordance with some embodiments of the disclosure. The panel meter 400 may be configured for installation in a panel of a substation or other settings where users may desire to view a display of power system attributes. The panel meter 400 may be configured to use signals 426 as representative of power system signals. Such signals may be analog or digital. The signals 426 may be provided using one or more primary protection relays (e.g., a feeder protection relay, a bus protection relay), integrators 350, or the like. In some embodiments, The signals 426 may be provided on nonelectrically conductive communication media, such as fiber optic media. The digitized analog signals 426 may be communicated in accordance with an expected protocol. Where the meter 400 receives digitized information, the meter may not require additional signal processing circuitry such as filters, A/D, transformers, or the like.

The power meter 400 may be configured to perform dedicated metering and display functions. The meter 400 may include a processing subsystem for executing the metering and other functions of the meter 400. As illustrated, the processing subsystem may be embodied as a field-programmable gate array (FPGA) 430 including instructions that, when executed, cause the meter 400 to perform functions in accordance with the instructions. The functions may include a signal processing subsystem 440 and metering subsystem 452. The signal processing subsystem 440 may include instructions useful for conditioning the digitized analog signals 426 into useful quantities for metering functions. The communications may be in accordance with a predetermined protocol. In some embodiments, the signal processing subsystem 440 and the and metering subsystem 452 may provide similar functionality to the signal processing and metering instruction discussed above.

In various embodiments, PPR 462 may be electrically isolated from power meter 400. Electrically isolating power meter 400 from PPR 462 may reduce the possibility of an operator receiving an electrical shock while using power meter 400. Further, electrically isolating power meter 400 from PPR 462 may facilitate the ability to hot-swap power meter 400 to PPR 462 without taking PPR 462 out of service or de-energizing a portion of the electric power system. In some embodiments, the communication between PPR 462 and power meter 400 may be transmitted on a nonelectrically conductive media such as, for example, fiber optic cables (e.g., a dielectric or non-conductive transmission medium or waveguide), other types of nonconductive or dielectric waveguides.

The metering subsystem 452 may include instructions for the use of the signals from the signal processing subsystem 440 to perform the selected metering functions. The available metering functions will depend on the settings and the type of panel meter 400. For example, if the meter 400 receives digitized analog signals 426 from a feeder protection relay 462, the available metering functions may be different than if the meter 400 receives digitized analog signals 426 from a bus protection relay 462.

In some embodiments, the meter 400 may not require user-provided settings, but instead, configure itself due to the type of primary protection relay 462 providing signals thereto. For example, the meter 400 may automatically detect and configure the meter 400 based on the type of protection relay 462 to which the meter 400 is connected and/or based on the signals 426 received by the meter 400. In various embodiments, PPR 462 may provide an identifier that allows meter 400 to determine the appropriate information to display. For example, if PPR 462 is a feeder relay, meter 400 may display A, B, and C, phase currents on display 418, and if PPR 462 is a transformer relay, meter 400 may display a low-side voltage and a high-side voltage. In some embodiments, meter 400 may comprise a database identifying the type of information to display for various types of relays.

The meter 400 may include one or more communications ports 410. In some embodiments, the communications ports 410 may be electrical. In some embodiments, the communications ports 410 may be optical (e.g., to interface with non-conductive media) to electrically isolate the meter 400 from the integrator, monitoring, automation, supervisory, or other systems and devices. The communications from communications ports 410 may be synchronous or asynchronous, and used for various predetermined purposes such as, for example, setting the meter 400, communication with monitoring, automation, supervisory or other systems or devices, communication with one or more meters, integrators, communication with one or more primary protection devices, testing, or the like.

The meter 400 may include a display subsystem 416 including one or more displays 418 or display screens configured to be visible to users when the meter 400 is installed. The display subsystem 416 may provide visible communications of power system attributes or characteristics calculated using the metering functions provided by the metering subsystem 452. The attributes or characteristics may include any as described above. For example, the display subsystem 416 on one or more meters 400 may provide visual indications one or more of voltage, current, watts, volt-ampere reactive (VAR), apparent power, frequency, volt-amperes (VA), power factor (PF), or combinations thereof of one or more phases of electric power signals (e.g., three phases).

In some embodiments, interaction with the meter 400 or portion thereof may alter data displayed by the display subsystem 416 on the display 418. For example, scrolling of the display 418 and/or rotation of the meter 400 may cause the display subsystem 416 to alter the attributes or values being presented to a user on the display 418. In some embodiments, the meter 400 may include one or more selectable elements (e.g., a toggle switch) that may lock the display 418 to one set of values and/or orientations in a first position and enable alteration of the values in a second position.

The attributes may further include an indication (e.g., an identification) of the primary protection relay 462 providing the digitized analog signals 426. For example, an indication or identification of the protection relay 462 may be indicated at variable display 420.

Figure 5:
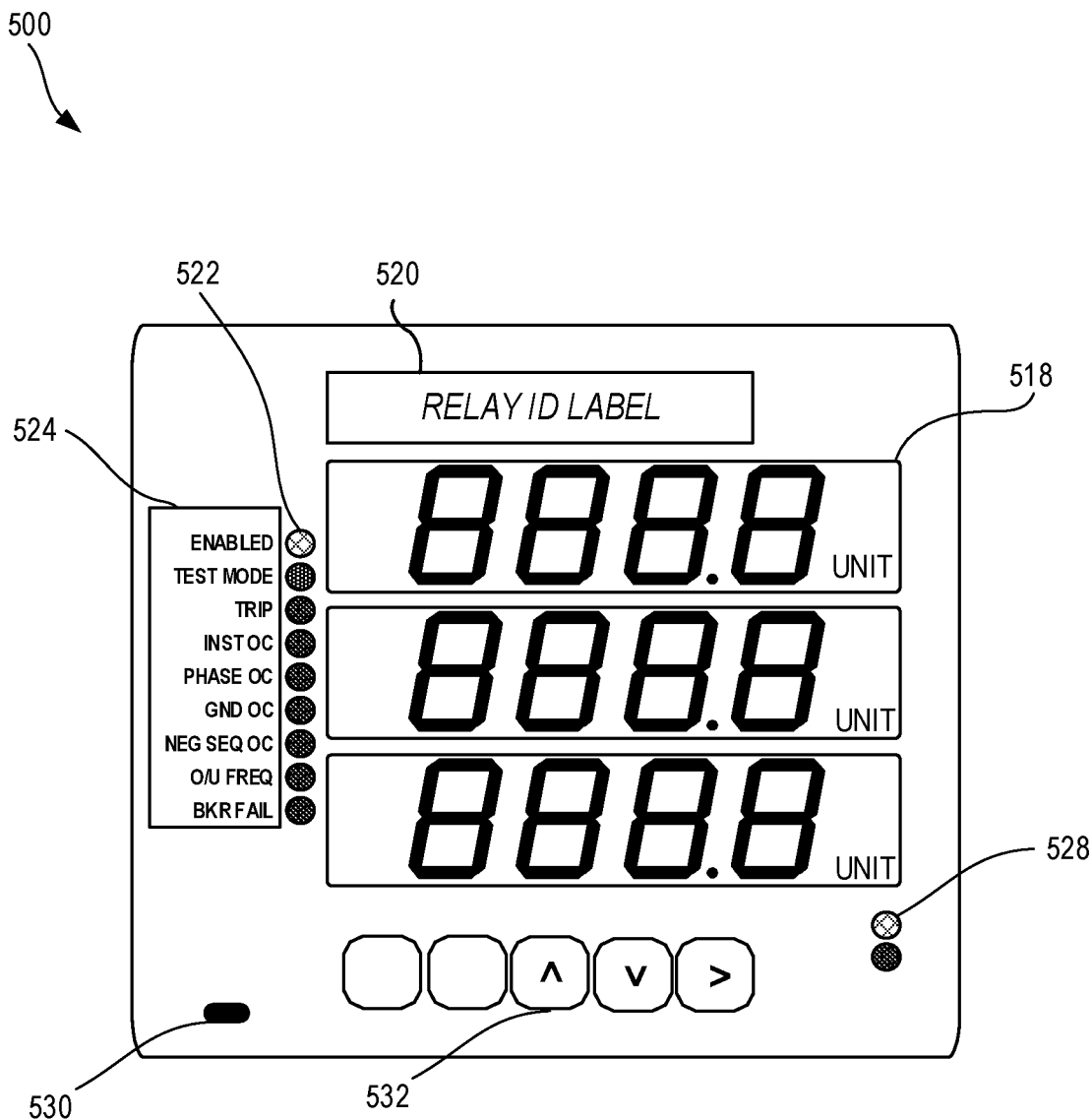
FIG. 5 illustrates a front view of a panel meter in accordance with embodiments of the disclosure.

FIG. 5 illustrates a sample front panel of a panel meter 500 in accordance with several embodiments disclosed herein. The panel meter 500 may display the status of a primary protection relay. The panel meter 500 may require no settings. The display 518 may include status and/or target indicators 522 (e.g., such as light-emitting diodes (LEDs)) allowing the meter to be located remotely on mimic bus or control room on a per-relay application. In some embodiments, all or some of the indicators 522 may include a corresponding label displayed in display area 524. The corresponding labels displayed in the display area 524 may be variable such that variable values displayed by the indicators 522 may include a corresponding identification in the display area 524. For example, where the meter 500 is automatically configurable based on the detected inputs or connected devices, the display area 524 may automatically update with a corresponding identification relating to the values provided by the indicators 522.

As noted above, the panel meter 500 may include an indication of the primary protection relay providing the digitized analog signals 526. For example, an indication or identification of the protection relay proving information to panel meter 500 may be indicated using variable label display 520. The variable label display 520 may identify the source of the information being displayed by panel meter 500.

In some embodiments, the display 518 may include a breaker status LED 528 to indicate a condition of one or more breakers in communication with protection relay.

In some embodiments, the meter 500 may be hot-swappable, allowing the meter 500 to be connected and/or disconnected without any particular steps or acts taken before such connection and/or disconnection. For example, the meter 500 may be connected and disconnected from a protection relay or other portions of the electric power system without the need to take the primary protection relay out of service or otherwise interrupting operation of the protection relay or other components of the electric power system.

The meter 500 may include a data port 530 enabling a user to plug in a computer or other device to receive event reports (e.g., event reports that have been sent to the meter by the primary protection relay). In one specific embodiment, the data port 530 may comprise a Universal Serial Bus (USB), Type C, port.

In some embodiments, the meter 500 may be a standard size (e.g., including an ANSI four-inch display) allowing for easy retrofit into the industrial market (e.g., into a portion of a standard electric power rack system). The display 518 may be relatively bright, easy to read, and always on. The meter 500 may store event records from the relay.

The meter 500 may also include user inputs (e.g., buttons) configured to receive a user input for display configuration or executing other options of the meter 500. For example, pressing the arrow pointed up may scroll through or alter the attributes or values being presented to a user on the display 518. In some embodiments, the meter 400 may include one or more selectable elements (e.g., a toggle switch) that may lock the display 518 to one set of values and/or orientations in a first position and enable alteration of the values in a second position.

Figure 6:
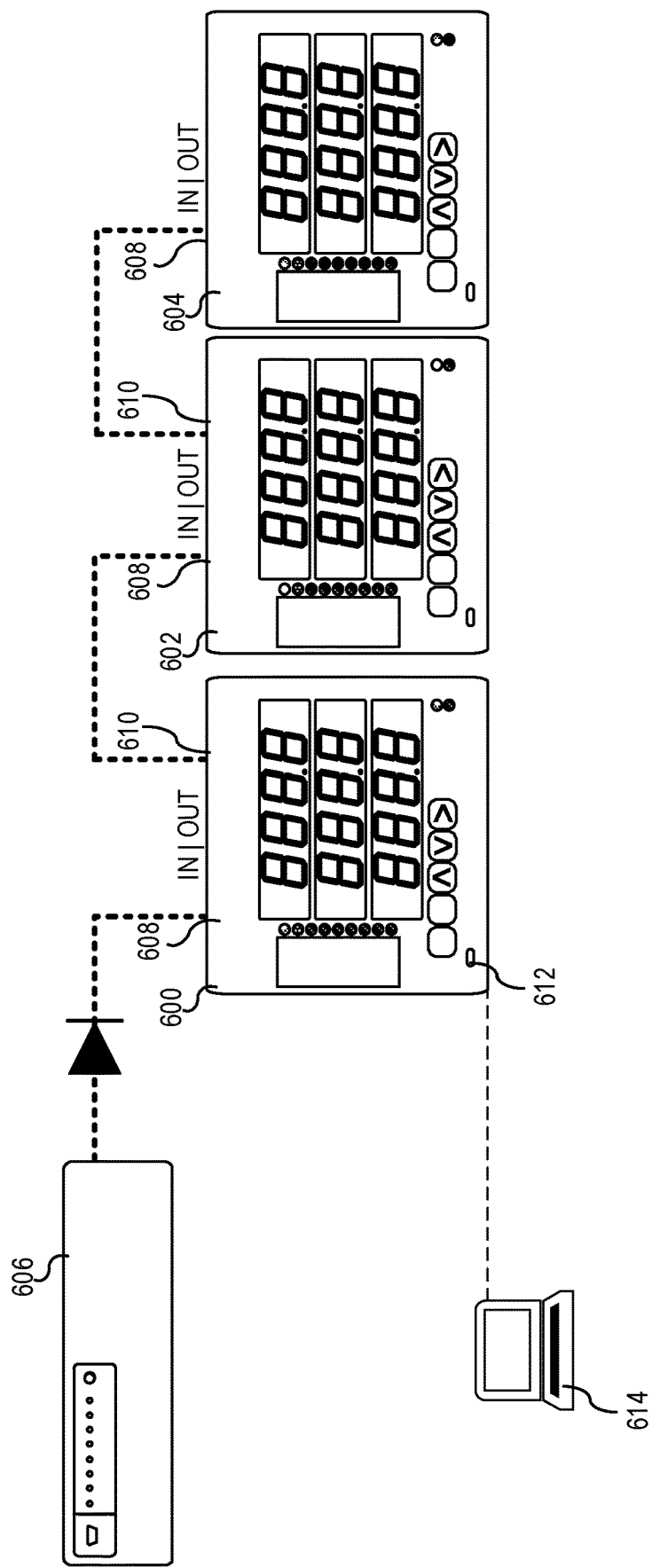
FIG. 6 illustrates a simplified block diagram of cascading panel meters in accordance with embodiments of the disclosure.

FIG. 6 illustrates a simplified block diagram of a system for displaying metering attributes of an electric power system using cascading panel meters (e.g., meters 600, 602, 604 in a daisy-chain configuration) in accordance with embodiments of the disclosure. As depicted, a primary protection relay 606 is illustrated. It may be seen that the communications are one-way from the primary protection relay 606 to the cascaded meters 600, 602, 604 (e.g., configured as a data diode or unidirectional security gateway). For example, communication between the protection relay 606 and each of the 600, 602, 604 is only allowed to travel in one direction away from the protection relay 606, and any communication in an opposing upstream direction is prohibited or otherwise restricted.

The meters 600, 602, 604 may each include as respective an input 608 and output 610 to facilitate cascading or daisy-chaining. In such a configuration, different attributes may be displayed on each panel meter 600, 602, 604. For example, a first meter 600 may display attributes with respect to phase A; a second meter 602 may display attributes with respect to phase B; and a third meter 604 may display attributes with respect to phase C. In another example, the meters 600, 602, 604 may display different attributes such as all three-phase amperes on the first meter 600; all three-phase voltages on the second meter 602; and all three-phase watts on the third meter 604. one or more of the cascaded meters 600, 602, 604 may store event reports for retrieval and/or backup purposes, in case another meter 600, 602, 604 or the integrator fails to store the event report.

A discussed above, at least the first meter 600 may include data port 612 enabling communication with another device (e.g., computer 614) to transmit event reports (e.g., reports that have been communicated to the meter 600 by the primary protection relay 606).

The panel meters 600, 602, 604 in accordance with embodiments of the disclosure may not require wiring to instrument transformers, but instead only a single input from the primary protection relay 606. No electrically conductive media are required to provide the digitized analog signals to the meters 600, 602, 604. The meters 600, 602, 604 may be easy to test by simple verification when testing the primary protection relay. Communication links may be verified with the test mode push button on the relay and the test mode LED on the meter 600, 602, 604.

Figure 7:
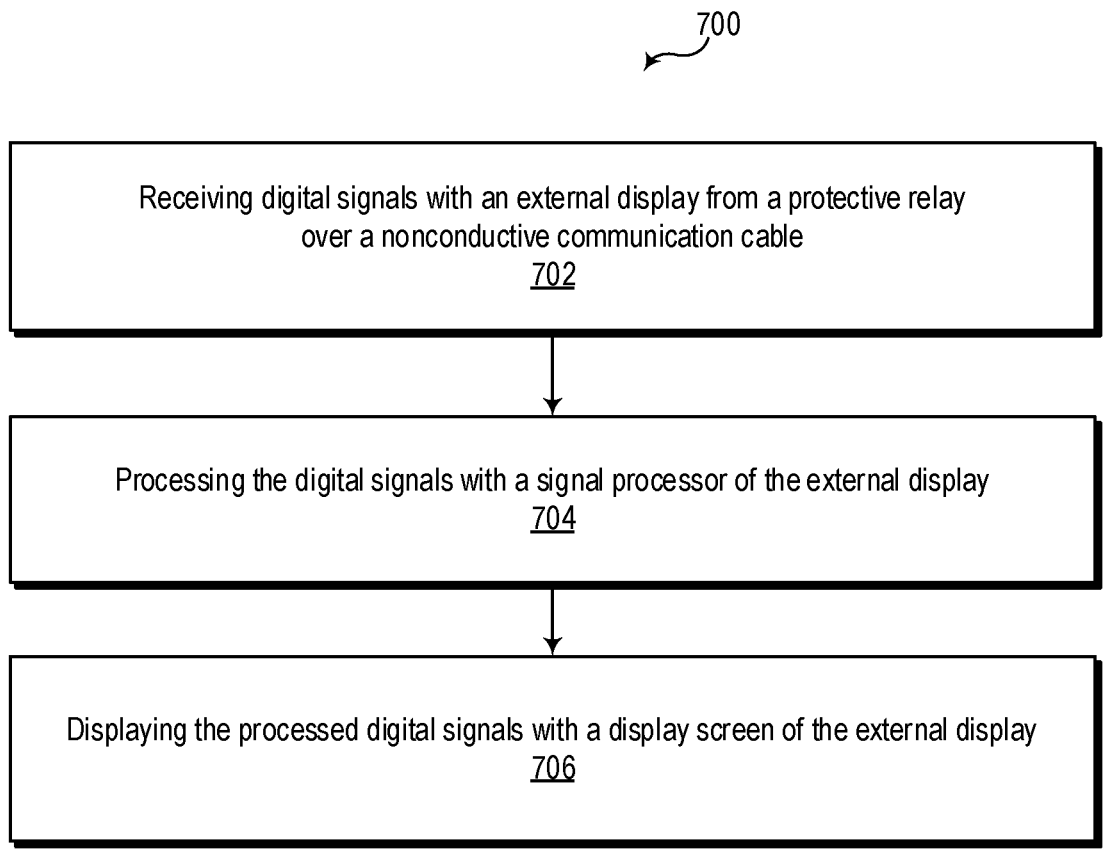
FIG. 7 illustrates a flow chart of displaying data from a protection relay of an electric power delivery system in accordance with embodiments of the disclosure.

FIG. 7 illustrates a flow chart of a method 700 of displaying data from a protection relay of an electric power delivery system. At 702, digital signals are received with an external display from a protective relay over a non-conductive communication cable. As discussed above, the external display is separate from the protection relay and/or other components of the electric power system. The external display may be selectively connected to and disconnected from various components of the electric power system to display attributes, values, and/or characteristics of the power system or components thereof. As discussed above, such an external device may be particularly useful where the components lack an integrated display or where the external display may present data not displayed on an integrated display. In some embodiments, the external display may automatically configure itself based on the signals received by the external display.

At 704, the digital signals are processed with a signal processor of the external display. For example, the incoming signals may be conditioned for presentation on a metering display to a user of the components of the electric power system.

At 706, the processed digital signals are displayed with a display screen of the external display.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. An electric power system panel meter, comprising:
a digital input to receive a plurality of digitized signals from at least one primary protection relay;
a non-transitory computer-readable storage medium comprising computer instructions for electric power system metering based on the digitized signals from the primary protection relay;
a processor to execute the computer instruction stored on the non-transitory computer-readable storage medium;
a display in communication with the processor to provide a human-readable visual indication of a plurality of values related to the electric power system metering; and
a communications port to communicate information from the primary protection relay to an external device;
wherein the electric power system panel meter is electrically isolated from the primary protection relay; and
wherein the digital input comprises a unidirectional digital input to receive the plurality of digitized signals from the primary protection relay and to restrict transmission of a signal to the primary protection relay from the panel meter.

2. The panel meter of claim 1, further comprising an output to communicate with another electric power system panel meter in a cascaded configuration.

3. The panel meter of claim 2, the meter to pass at least some of the analog signals from the primary protection relay from the at least one input to the output to be received by the another electric power system panel meter.

4. The panel meter of claim 1, wherein the digital input comprises a fiberoptic communication input.

5. The panel meter of claim 1, further comprising a user interface to configure the information on the display.

6. The panel meter of claim 1, wherein the processor is to automatically configure the display based on the digitized signals received from the primary protection relay.

7. The panel meter of claim 1, the digital input to receive the plurality of digitized signals from the primary protection relay via a non-conductive communication media.

8. The panel meter of claim 1, wherein the panel meter is connectable to the primary protection relay while the primary protection relay is in continuous operation.

9. The panel meter of claim 1, wherein the information communicable through the communications port comprises an event report.

10. An electric power system panel meter, comprising:
a digital input to receive a plurality of digitized signals from at least one primary protection relay;
a non-transitory computer readable storage medium comprising computer instructions for electric power system metering based on the digitized signals from the primary protection relay;
a processor to execute the computer instruction stored on the non-transitory computer readable storage medium;
a display in communication with the processor to provide a human-readable visual indication of a plurality of values related to the electric power system metering;
a communications port to communicate information from the primary protection relay to an external device; and
an output to communicate with another electric power system panel meter in a cascaded configuration;
wherein the electric power system panel meter is connectable to the primary protection relay while the primary protection relay is in continuous operation.

11. The panel meter of claim 10, wherein the digital input comprises a unidirectional digital input to receive the plurality of digitized signals from the primary protection relay and to restrict transmission of a signal to the primary protection relay from the panel meter.

12. The panel meter of claim 10, the meter to pass at least some of the digitized analog signals from the primary protection relay from the at least one input to the output to be received by the another electric power system panel meter.

13. The panel meter of claim 10, further comprising a user-interface to configure the information on the display.

14. The panel meter of claim 10, wherein the processor is to automatically configure the display based on the digitized signals received from the primary protection relay.

15. The panel meter of claim 10, the digital input to receive the plurality of digitized signals from the primary protection relay via a non-conductive communication media.

16. The panel meter of claim 10, wherein the panel meter is connectable to the primary protection relay while the primary protection relay is in continuous operation.

17. The panel meter of claim 10, wherein the information communicable through the communications port comprises an event report.

18. An electric power system panel meter, comprising:
  a digital input to receive a plurality of digitized signals from at least one primary protection relay;
  a non-transitory computer readable storage medium comprising computer instructions for electric power system metering based on the digitized signals from the primary protection relay;
  a processor to execute the computer instruction stored on the non-transitory computer readable storage medium;
  a display in communication with the processor to provide a human-readable visual indication of a plurality of values related to the electric power system metering; and
  a communications port to communicate information from the primary protection relay to an external device;
  wherein the electric power system panel meter is connectable to the primary protection relay while the primary protection relay is in continuous operation; and
  wherein the digital input comprises a fiberoptic communication medium.

* * * * *